United States Patent [19]

Miyasaka

[11] Patent Number: 4,476,547
[45] Date of Patent: Oct. 9, 1984

[54] DRAM WITH INTERLEAVED FOLDED BIT LINES

[75] Inventor: Kiyoshi Miyasaka, Yokohama, Japan
[73] Assignee: Fujitsu Limited, Kawasaki, Japan
[21] Appl. No.: 327,691
[22] Filed: Dec. 4, 1981
[30] Foreign Application Priority Data Dec. 26, 1980 [JP] Japan ............................... 55-188934

[51] Int. Cl.$^3$ ...................... H01L 27/04; G11C 11/40
[52] U.S. Cl. ..................................... 365/205; 357/23;
357/41; 357/45; 365/149; 365/208
[58] Field of Search ................. 357/23 C, 41; 365/72,
365/149, 150, 182, 205, 207, 208, 210

[56] References Cited

U.S. PATENT DOCUMENTS

| | | | |
|---|---|---|---|
| 4,044,340 | 8/1977 | Itoh | 357/41 |
| 4,160,275 | 7/1979 | Lee et al. | 365/205 |
| 4,216,489 | 8/1980 | Clemens et al. | 357/23 C |
| 4,355,374 | 10/1982 | Sakai et al. | 357/23 C |

OTHER PUBLICATIONS

IEEE Transactions on Electron Devices, V. L. Rideout, vol. ED26, No. 6, Jun. 1979, pp. 846-847.
IBM Technical Disclosure Bulletin, K. L. Anderson, vol. 20, No. 11A, Apr. 1978, pp. 4295-4296.

Primary Examiner—William D. Larkins
Attorney, Agent, or Firm—Staas & Halsey

[57] ABSTRACT

The present invention discloses a memory cell layout of a dynamic RAM of a folded bit line type MOS FET wherein the bit line pairs are extended in parallel away from the sense amplifiers.

The present invention includes a particular bit line pair and at least one bit line of an adjacent bit line pairs positioned between the particular bit line pair and makes the capacitor regions corresponding to the mutually adjacent bit lines interleave and thereby improves the area efficiency of the capacitor region.

12 Claims, 9 Drawing Figures

FIG. 8
FIG. 9
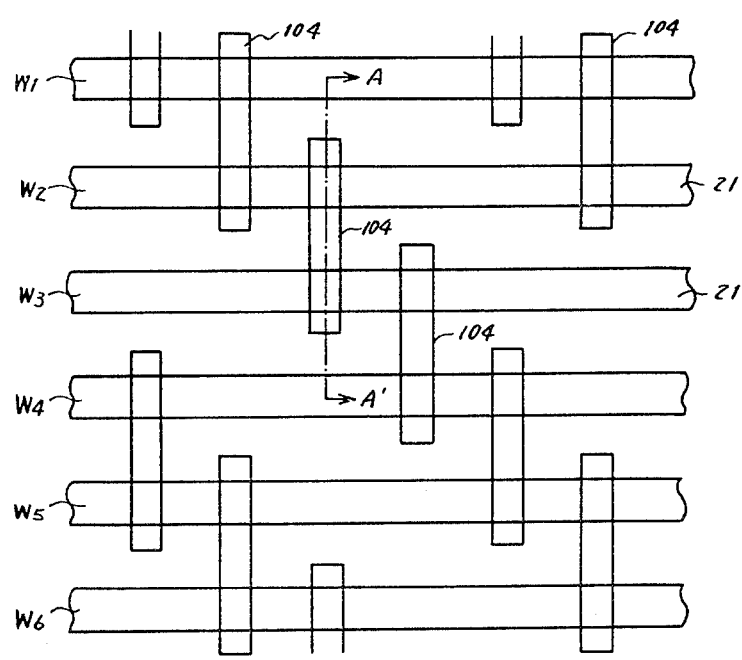
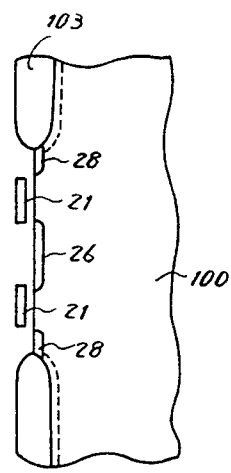

DRAM WITH INTERLEAVED FOLDED BIT LINES

BACKGROUND OF THE INVENTION

1. Field of the Invention

This invention relates to a random access memory arrangement for a semiconductor memory device, and particularly to a 1-MIS transistor-1-capacitor type semiconductor memory device which has improved integration density by employing folded bit lines.

2. Description of the Prior Art

The 1-MOS transistor-1-capacitor type random access memory (RAM) is roughly classified, normally, into two types in accordance with the arrangement of the pairs of bit lines connected to the sense amplifiers. The memory of the first type has an arrangement where each of a pair of bit lines of the bit line pair are on opposite sides of the sense amplifier and run away from the sense amplifier in right and left directions respectively. The prior art reference, U.S. Pat. No. 4,012,757 discloses such a memory. The memory of the second type has an arrangement where a pair of bit lines run in parallel with each other away from the sense amplifier in only one direction. The prior art reference, U.S. Pat. No. 4,044,340 discloses such a second type of memory.

The RAM of the 1-transistor-1-capacitor type comprises a plurality of memory cells each having a capacitor for storing data and a transfer transistor for electrically connecting the capacitor to the bit lines. Readout of data is carried out as explained below. Charges stored in the capacitors of selected memory cells are transferred to the bit lines, the potential of bit lines is amplified by the sense amplifier and then the signal obtained is transferred to the outside via the bus line.

The RAM of this type is required to have capacitors having a large capacitance for each memory cell in order to realize an error-less readout of data and a long refresh time. However, when the memory is required to have a large information storage capacity, the capacitors tend to occupy less area. Therefore, it has normally been a contradictory requirement for the 1-transistor-1-capacitor type RAM to realize both large capacity storage and error-less readout of data with a long log refresh time.

SUMMARY OF THE INVENTION

It is an object of the present invention to provide a semiconductor memory device having a large storage capacity and a wider capacitor region for each memory cell.

It is another object of the present invention to provide a semiconductor memory device having a high capacitor region area efficiency (ratio of area of capacitor region to the memory cell area).

In order to achieve the above objects, according to the present invention, there is provided a semiconductor memory device comprising: a plurality of first and second word lines; a plurality of sense amplifiers; and a plurality of pairs of bit lines. Said pair of bit lines comprising first and second bit lines which are connected to said sense amplifier and extend, in parallel which each other, away from said sense amplifier. Also included are a plurality of memory cells, each memory cell comprising a storage capacitor and being disposed at one of the cross points of said first word lines and said first bit lines and at one of the cross points of said second word lines and said second bit lines. Said first or second bit line of any one pair of bit lines is arranged between said first bit line and second bit line of any other pair of bit lines. According to the present invention, there is also provided a semiconductor memory device further comprising: a transfer transistor through which said storage capacitor is connected to said bit line; and a capacitor region at which said storage capacitor is disposed. Said capacitor regions corresponding to one bit line and said capacitor regions corresponding to a bit line adjacent to the one bit line are arranged to shifted with respect to each other in a direction parrallel to said bit line.

BRIEF DESCRIPTION OF THE DRAWINGS

FIG. 8 is a plan view of the RAM shown in FIG. 5 during a state of the the production process.

FIG. 9 is a sectional view of the RAM shown in FIG. 5 during the production process.

The present invention will be more clearly understood from the following description contrasting the present invention with the conventional devices and with reference to the accompanying drawings.

DESCRIPTION OF THE PREFERRED EMBODIMENT

Figure 1:
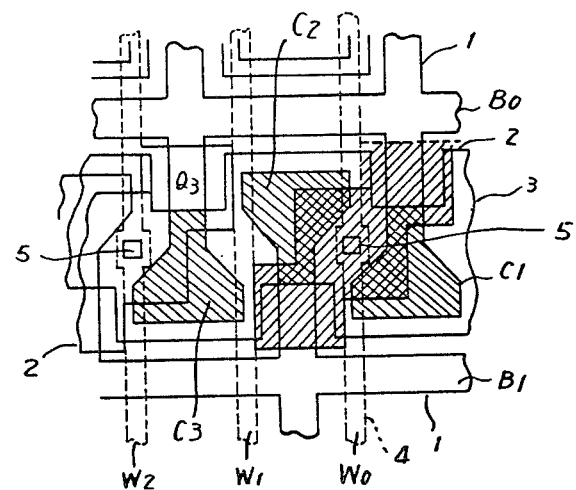
FIG. 1 is the plan view of the memory pattern of a conventional 1-transistor-1-capacitor type dynamic RAM.
Figure 2:
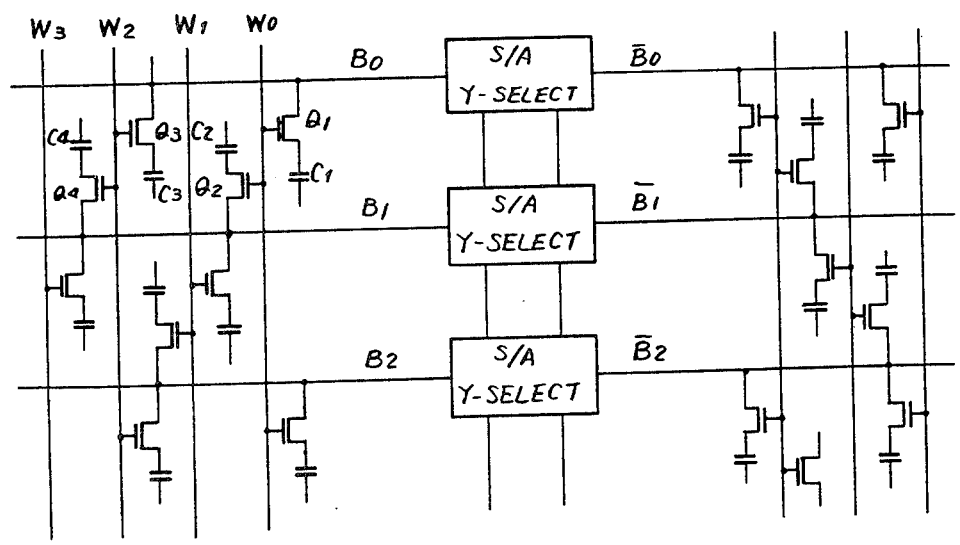
FIG. 2 is a schematic diagram of the RAM shown in FIG. 1.
Figure 3:
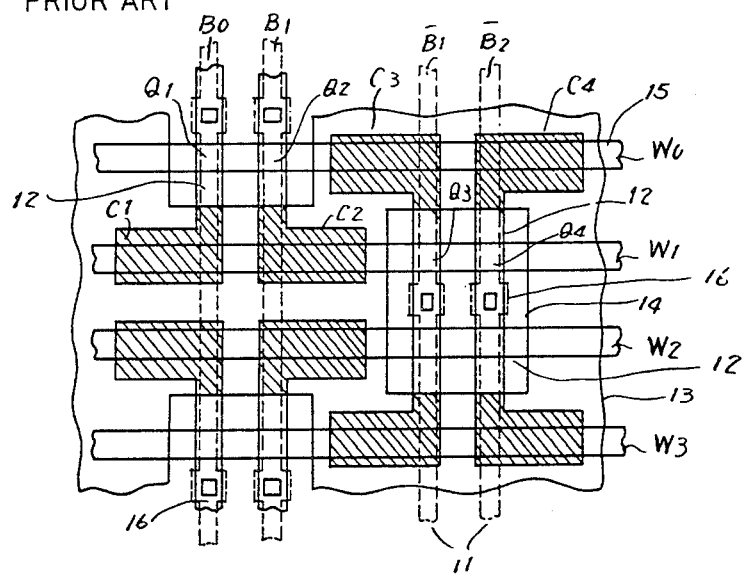
FIG. 3 is a plan view of the memory cell pattern of the conventional folded bit line type dynamic RAM.
Figure 4:
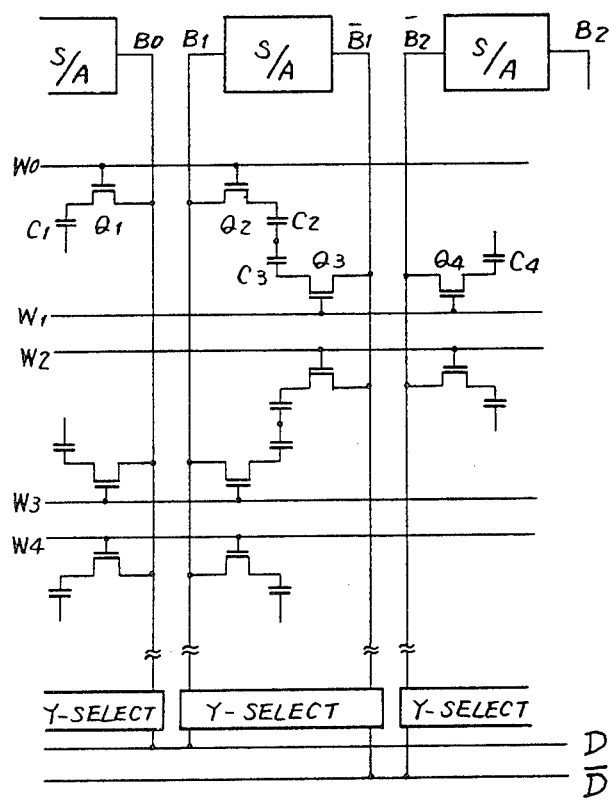
FIG. 4 is a schematic diagram of the RAM shown in FIG. 3.

A plan view of a memory cell pattern of a conventional 1-transistor-1-capacitor type dynamic RAMS is shown in FIG. 1 and FIG. 3. The schematic diagrams respectively corresponding to FIG. 1 and FIG. 2 are also shown in FIG. 2 and FIG. 4.

The conventional RAM shown in FIG. 1 and FIG. 2 corresponds to the first type mentioned above and is generally called the open bit line type, wherein the bit line pairs ($B_0$, $\overline{B}_0$), ($B_1$, $\overline{B}_1$), ($B_2$, $\overline{B}_2$), . . . extend from both sides of the sense amplifier S/A. Y SELECT is the column selection circuit, which selects the bit line pairs and connects the selected bit line pair to the data bus line (not illustrated). $Q_1$, $Q_2$, $Q_3$, . . . are transfer transistors; $C_1$, $C_2$, $C_3$, . . . are a capacitors; and 1-bit memory cell is formed by $Q_i$, $C_i$ ($i = 1, 2, \ldots$). $W_0$, $W_1$, . . . are word lines.

The readout operation for memory cell $Q_1$, $C_1$ is carried out as explained below. The word line $W_0$ is set to the H (high) level, the transistor $Q_1$ is turned ON and the potential of bit line $B_0$ is determined in accordance with the charge stored in the capacitance of capacitor $C_1$. Simultaneously, the potential of bit line $\overline{B}_0$ is determined in accordance with the charged stored in the capacitance of capacitor of a dummy cell (not reference number illustrated) connected to the bit line $\overline{B}_0$. A voltage difference between both bit lines $B_0$ and $\overline{B}_0$ is detected by the sense amplifier S/A and then amplified and finally transferred to the data bus line (not illustrated).

In the pattern of FIG. 1, the bit lines $B_0$, $B_1$, ... are basically formed of diffusion layers provided within a substrate. The capacitors $C_1$, $C_2$, ... are composed of a first channel region (hatched from upper left to lower right). In the area between bit lines $B_0$, $B_1$, ... and the capacitors $C_1$, $C_2$, ..., the transfer transistors $Q_1$, $Q_2$, ... are provided, and each transistor is composed of a second channel formation region where a second polycrystalline silicon layer 2 (hatched from upper right to lower left) is used as the gate electrode. One electrode of capacitors $C_1$, $C_2$ ... is formed within the substrate, while the other electrode is formed by a first polycrystalline silicon layer 3. The word lines $W_0$, $W_1$ ... are formed of an aluminium (Al) wiring layer 4 and connected to the polycrystalline silicon layer 2 of the gate electrodes of two transistors via the contact hole 5.

The conventional RAM shown in FIG. 3 and FIG. 4 corresponds to the second type device mentioned above. The bit line pairs $(B_0, \overline{B}_0)$, $(B_1, \overline{B}_1)$, $(B_2, \overline{B}_2)$, ... extend in one direction in parallel away from the sense amplifier S/A. This second type is generally called the folded bit line type. $W_0$, $W_1$, ... are word lines; Y-SELECT is the column selection circuit; D and $\overline{D}$ are data bus lines. Here, the readout operation and write operation are not explained because they are the same as those of the first type device.

In FIG. 3, the bit lines $B_0$, $B_1$, ... are formed of an aluminium wiring layer 11. The diffusion layers 12 provided within the substrate become the source and drain regions of transistors $Q_1$, $Q_2$, ... The capacitors $C_1$, $C_2$ ... are formed in a channel region (hatched from upper left to lower right). One electrode of the capacitor is composed of the substrate, while the other electrode is composed of a first polycrystalline silicon layer 13. The word lines $W_0$, $W_1$, ... are composed of a second polycrystalline silicon layer. 16 is a contact hole which connects the bit line of aluminium wiring layer 11 and the diffusion layer 12 and is formed at a window 14 provided on the first polycrystalline silicon layer 13.

The layout system of the conventional dynamic RAM explained above has a low area efficiency for the capacitors, even if in the upper limit of the layout density is attained namely the area ratio for capacitors for the memory cell area as low as 20 to 30%. The present invention is intended to improve the area efficiency of capacitors and thereby to achieve a high capacity memory and high integration density.

Figure 5:
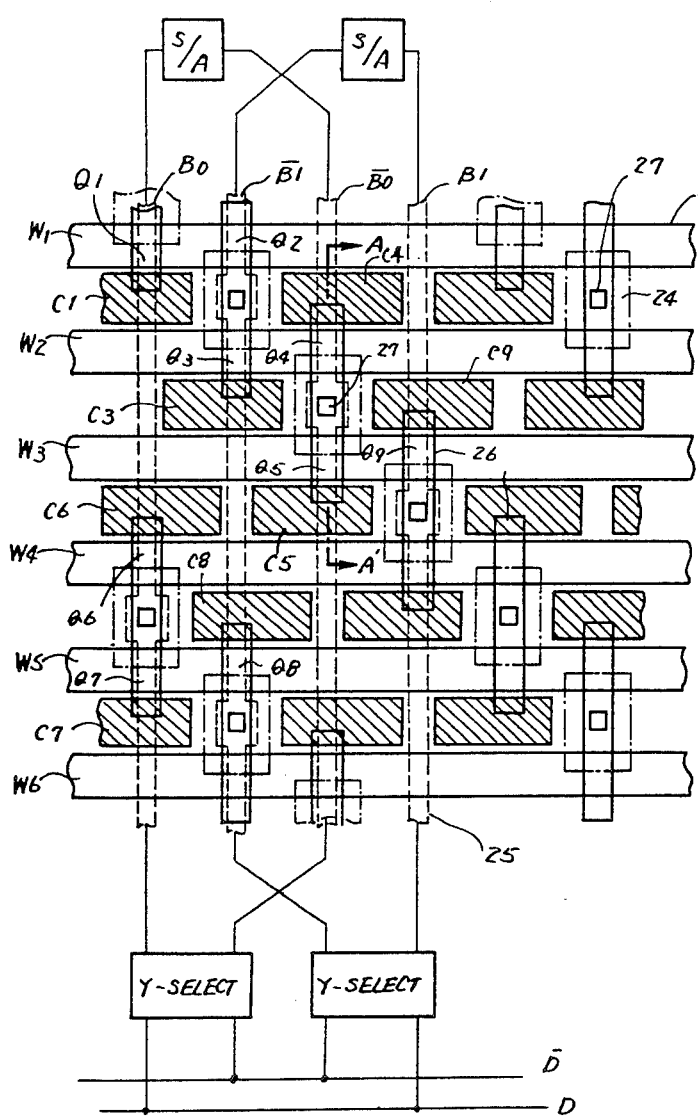
FIG. 5 is a plan view of a memory cell of the RAM as an embodiment of the present invention.
Figure 6:
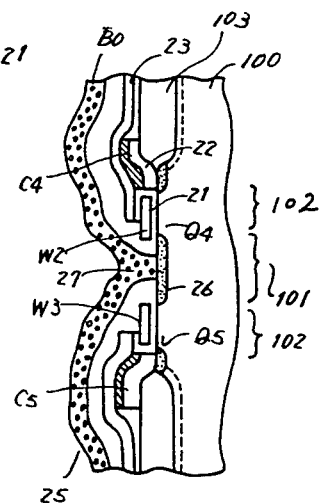
FIG. 6 is a sectional view of the memory cell of the RAM shown in FIG. 5.
Figure 7:
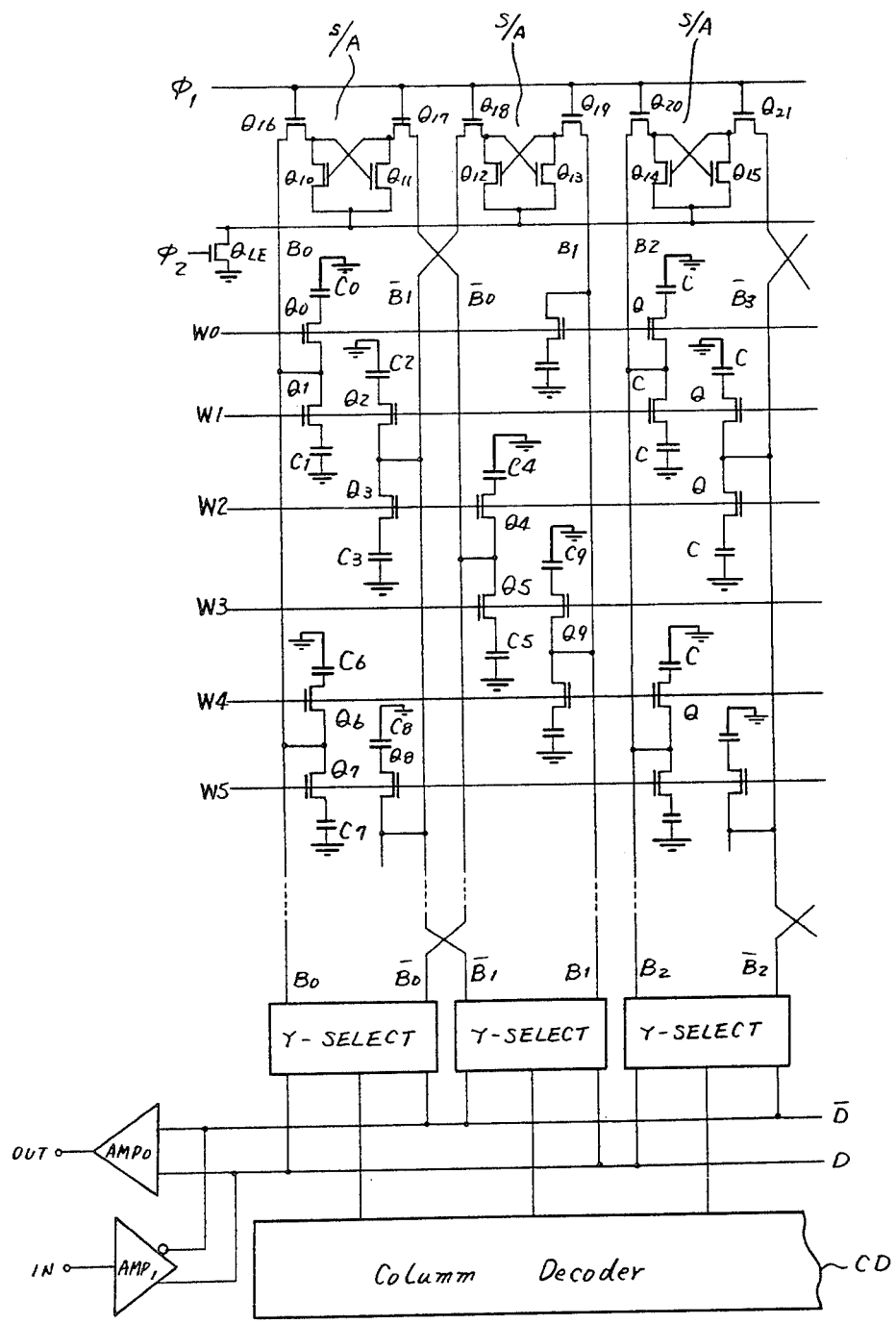
FIG. 7 is an equivalent schematic diagram of the RAM shown in FIG. 5.

The preferred embodiment of the present invention is explained below. FIG. 5 is a plan view of the memory cell pattern of this embodiment. FIG. 6 is a sectional view along the line A-A' of FIG. 5 and FIG. 7 is an equivalent schematic diagram of FIG. 5. The same portions as the conventional ones are indicated by the same reference symbols.

As shown in FIG. 5 and FIG. 7, first one bit line of and adjacent bit line pair is provided between the bit line pairs $(B_0, \overline{B}_0)$, $(B_1, \overline{B}_1)$, ... in the case of the present invention. Second, as shown in FIG. 5, the capacitor region (hatched area) where the capacitors corresponding to each of the bit lines are formed is formed in such a manner that the capacitor regions of adjacent bit lines are shifted vertically, and in more detail, they are mutually interleaved. For example, the bit line $\overline{B}_1$ exists between the bit lines $B_0$ and $\overline{B}_0$.

As shown in FIG. 6, each memory cell comprises the contact region 101, transfer region 102 and capacitor regions $C_4$ and $C_5$. In the contact region 101, the diffusion region 26 provided within the substrate 100 and the bit line $\overline{B}_0$ comprising the aluminium wiring layer 25 are connected. At the transfer region 102, on the other hand, the word lines $W_2$ and $W_3$ which are used as the gate electrode 21 are formed over the substrate 100 and separated by a gate insulating film from the substrate 100 and thereby the MIS FET transfer transistor is formed.

Concerning the layout of the capacitor region, the capacitor regions $C_3$, $C_4$, $C_5$, $C_6$ and $C_9$ are formed, for example, between the word lines $W_1$, $W_2$, $W_3$, $W_4$ and $W_5$. The capacitor regions $C_3$ and $C_9$ corresponding to the adjacent bit lines $\overline{B}_1$ and $B_1$ are provided between two word lines $W_2$ and $W_3$ between the capacitor regions $C_4$ and $C_5$ corresponding to the bit line $\overline{B}_0$.

Moreover, in this embodiment, the memory cell consisting of $Q_4$ and $C_4$ and that consisting of $Q_5$ and $C_5$ are connected to the bit line $\overline{B}_0$ via the same contact region 101. The other memory cell pair of the same bit line pair is provided to the sense amplifier S/A via the two word lines $W_4$ and $W_5$. The capacitor regions $C_3$ and $C_9$ corresponding to the adjacent bit lines $\overline{B}_1$ and $B_1$ are provided between two word lines $W_2$ and $W_3$ of the memory cell pair.

In addition, the contact region of the adjacent bit lines are provided with a little positional deviation by as much as one word line in order to prevent multiple selection. This is because if the bit lines $(B_0, \overline{B}_1)$, $(\overline{B}_0, B_1)$ are directly connected to the sense amplifier S/A as the bit line pair, an unwanted phenomenon occurs, namely, $(Q_1, C_1)$, $(Q_2, C_2)$ are selected simultaneously when the word line $W_1$ is selected. For this reason, the present invention successfully eliminates such disadvantage by providing the one of the other bit lines of an adjacent pair between the concerned bit line pair.

In FIG. 7, the sense amplifiers S/A each comprise a flip-flop circuit where the gates and drains of two transistors $(Q_{10}, Q_{11})$, $(Q_{12}, Q_{13})$, $(Q_{14}, Q_{15})$ are respectively cross-coupled. The sense amplifiers S/A are activated by the transistor $Q_{LE}$ which is controlled by the clock signal $\phi_2$. On the other hand, the sense amplifiers S/A are connected to the bit line pair via the transistors $Q_{16}$ to $Q_{21}$, respectively, which are controlled by the signal $\phi_1$. D and $\overline{D}$ are data bus lines connected to the output amplifier $AMP_O$ and input amplifier $AMP_I$. CD is the column decoder circuit which selects the column selection circuit Y-SELECT.

The memory cell of this embodiment utilizes three layers of polycrystalline silicon and a single metal (aluminum)layer. The the first layer 21 is the word line; the second layer 22 is the first electrode of capacitor; and the third layer 23 is the common second electrode of the capacitor. The third layer 23 is formed continuously on the entire part. The metal layer 25 is the bit line.

An example of a production method used in this embodiment is explained below with reference to FIGS. 5, 6, 8 and 9.

The thick silicon oxide film 103 is formed on the surface of the monocrystalline silicon substrate 100 in all areas except for the area 104 indicated in FIG. 8. Next, the word lines $W_1$, $W_2$, ... comprising the polycrystalline silicon layer 21 of the first layer and the diffusion regions 26 and 28 are formed.

Thereafter, the first capacitor electrode consisting of the polycrystalline silicon layer 22 (FIG. 6) of the second layer is formed and it is connected to the diffusion layer region 28, which is used as the first electrode extended on the thick oxide film 103. On this layer 22, the polycrystalline silicon layer 23 of the third layer is formed covering layer 22 entirely and separated by a dielectric layer and it is used as the second electrode of the capacitor. Therefore, this layer 23 is connected, for example, to the regulated power source such as the ground power supply. Then, the window 24 is provided in the area corresponding to the contact region of this layer 23. Finally, the aluminium wiring layer 25 is formed on the polycrystalline silicon layer 23 of the third layer and used as the bit line. This metal wiring layer 25 is connected to the diffusion region 26 in the contact region.

In above embodiment, only one bit line of one of the bit lines of the other bit line pair is provided between the bit line pairs, but the present invention allows one of the bit lines from a plurality of the other bit line pairs to exist between the particular bit line pairs.

As explained previously, according to the present invention, the capacitor regions $C_1$, $C_2$, ... of each memory are integrated effectively. Therefore, the area efficiency of capacitors can be improved to as as high as about 40%. Thereby, a large capacity memory can be realized, a readout operation can be stabilized and an interval of refresh time can be made sufficiently long.

We claim:

1. A semiconductor memory device formed on a substrate, comprising:
    a plurality of first and second word lines;
    a plurality of sense amplifiers;
    a plurality of pairs of bit lines, each said pair of bit lines comprising first and second bit lines which are operatively connected to corresponding sense amplifiers and extended, parallel with each other, from said sense amplifiers and orthogonal to said word lines; and
    a plurality of memory cells arranged in pairs and having a contact region between each pair of memory cells, said contact region operatively connected to one of said bit lines, said memory cells pairs corresponding to one of the bit lines are adjacent to each other and separated by two word lines, each memory cell comprising:
    a transfer transistor having a transfer region operatively connected to and contiguous to said contact region, and a gate disposed at said transfer region and being a part of one of said word lines; and
    a storage capacitor having a capacitor region disposed contiguous to and operatively connected to said transfer region and between a pair of word lines, said capacitor regions corresponding to the one bit line are shifted, in a direction parallel to said bit lines, with respect to said capacitor regions corresponding to an adjacent bit line and are disposed between said capacitor regions corresponding to the adjacent bit line;
    said first or second bit line of any one pair of bit lines being arranged between said first bit line and second bit line of any other pair of bit lines.

2. A semiconductor memory device as set forth in claim 1, wherein said capacitor regions corresponding to said one bit line and said capacitor regions corresponding to said adjacent bit line are interleaved with each other.

3. A semiconductor memory device as set forth in claim 1 or 2, wherein said first or second bit line of one pair of bit lines is arranged between said first bit line and second bit line of an adjacent pair of bit lines.

4. A semiconductor memory device as set forth in claim 1 or 2, wherein each of said capacitor regions comprises:
    a substrate;
    an insulation layer formed on said substrate;
    a diffusion region formed in said substrate;
    a first electrode layer being connected to said diffusion region, formed on and extending over said insulation layer on said substrate;
    a dielectric layer formed on said first electrode layer; and
    a second electrode layer formed over said first electrode layer on said dielectric layer.

5. A semiconductor memory device as set forth in claim 4, wherein said second electrode layers are formed having a common conductive layer over said substrate, and said memory device further comprising one of said bit lines lines formed over said common conductive layer and said common conductive layer having a hole at said contact region, through which the one of said bit lines over said common conductive layer is connected to said diffusion region in said substrate of said contact region.

6. A semiconductor memory device as set forth in claim 5, wherein said word line is disposed under said common conducting layer.

7. A semiconductor memory device as set forth in claim 4, wherein said substrate comprises a monocrystalline semiconductor, wherein said word line, said first and second electrode layer comprise polycrystalline silicon, and wherein said bit line comprises metal.

8. A semiconductor memory device as set forth in claim 5, wherein said substrate comprises a monocrystalline semiconductor, wherein said word line, said first and second electrode layer comprise polycrystalline silicon, and wherein said bit line comprises metal.

9. A semiconductor memory device as set forth in claim 6, wherein said substrate comprises a monocrystalline semiconductor, wherein said word line, said first and second electrode layer comprise polycrystalline silicon, and wherein said bit line comprises metal.

10. A semiconductor memory device, comprising:
    first and second sense amplifiers;
    first and second bit lines operatively connected to said first sense amplifier;
    third and fourth bit lines operatively connected to said second sense amplifier, said first bit line being adjacent to said third bit line, said second bit line being adjacent to said fourth bit line, and said second and third bit lines being adjacent to each other;
    first through third word lines; and
    first through fourth memory cells operatively connected to respective ones of said bit lines and said first through third word lines, each of said first through fourth memory cells comprise:
    a transfer transistor operatively connected to the respective one of said bit lines and the respective word line; and
    a first capacitor region having disposed therein a storage capacitor operatively connected to said transfer transistor, said first capacitor regions of said first through fourth memory cells of adjacent bit lines are shifted and interleaved with respect to each other, where said first capacitor region corresponding with said first bit line is disposed between said second and third word lines, said first capacitor region corresponding to said second bit line is disposed between said second and third word lines, said first capacitor region corresponding to said third bit line is disposed between said first and second word lines and said first capacitor region corresponding to said fourth bit line is disposed between said first and second word lines.

11. A semiconductor memory device as set forth in claim 10, wherein each of said first through fourth memory cells further comprise:
 a contact region operatively connecting said transfer transistor to the respective one of said bit lines; and
 a first transfer region contiguous to said contact region having said transfer transistor disposed therein.

12. A semiconductor memory device as set forth in claim 11, further comprising:
 a pair of word lines operatively connected to said transfer transistors of said first and second memory cells; and
 a fifth memory cell operatively connected to a one of said first through fourth bit lines;
 wherein said contact region is common to both said transfer transistor and said fifth memory cell;
 wherein said fifth memory cell comprises:
 a second transfer region disposed on the opposite side of said contact region from said first transfer region; and
 a second capacitor region contiguous to said second transfer region; and
 wherein said first capacitor regions of said first and second memory cells are disposed between said pair of word lines.

* * * * *

UNITED STATES PATENT AND TRADEMARK OFFICE
CERTIFICATE OF CORRECTION

PATENT NO. : 4,476,547
DATED : OCTOBER 9, 1984
INVENTOR(S) : KIYOSHI MIYASAKA

It is certified that error appears in the above-identified patent and that said Letters Patent is hereby corrected as shown below:

Col. 2, line 29, "state" should be --stage--.

Col. 3, line 43, after "attained" insert --,--.

Col. 2, line 29, "the" (second occurrence) should be deleted.

Signed and Sealed this

Twentieth Day of August 1985

[SEAL]

Attest:

DONALD J. QUIGG

Attesting Officer     Acting Commissioner of Patents and Trademarks